US006670638B2

(12) United States Patent
Tamura et al.

(10) Patent No.: US 6,670,638 B2
(45) Date of Patent: Dec. 30, 2003

(54) LIQUID CRYSTAL DISPLAY ELEMENT AND METHOD OF MANUFACTURING THE SAME

(75) Inventors: Takuo Tamura, Yokohama (JP); Kiyoshi Ogata, Yokohama (JP); Yoichi Takahara, Yokohama (JP); Hironaru Yamaguchi, Yokohama (JP); Yoshinobu Kimura, Tokyo (JP); Makoto Ohkura, Fuchyu (JP); Hironobu Abe, Chiba (JP); Shigeo Shimomura, Mobara (JP); Masakazu Saitou, Mobara (JP); Michiko Takahashi, Mobara (JP)

(73) Assignee: Hitachi, Ltd., Tokyo (JP)

( * ) Notice: Subject to any disclaimer, the term of this patent is extended or adjusted under 35 U.S.C. 154(b) by 28 days.

(21) Appl. No.: 09/793,972

(22) Filed: Feb. 28, 2001

(65) Prior Publication Data

US 2002/0036289 A1 Mar. 28, 2002

(30) Foreign Application Priority Data

Sep. 25, 2000 (JP) ........................................ 2000-295425

(51) Int. Cl.[7] ................................................ H01L 29/04
(52) U.S. Cl. .............................. 257/64; 257/66; 257/72; 257/52; 257/55; 257/627; 257/628
(58) Field of Search ............................... 257/64, 66, 72, 257/52, 55, 627, 628

(56) References Cited

U.S. PATENT DOCUMENTS

| 5,942,768 A | * | 8/1999 | Zhang ........................ 257/627 |
| 6,180,957 B1 | * | 1/2001 | Miyasaka et al. ............. 257/336 |
| 6,329,270 B1 | * | 12/2001 | Voutsas ................ 257/E29.293 |

FOREIGN PATENT DOCUMENTS

| EP | 0 301 463 A | * | 2/1989 | ........... H01L/29/78 |
| EP | 0 558 075 A2 | * | 9/1993 | ........... H01L/29/04 |
| GB | 2 239 126 A | * | 6/1991 | ........... H01L/29/78 |
| JP | 05-013327 | | 1/1993 | |
| JP | 06-069139 | | 3/1994 | |
| JP | 06-160897 | | 6/1994 | |
| JP | 07-086601 | | 3/1995 | |
| JP | 07-153684 | | 6/1995 | |
| JP | 07-321339 | | 12/1995 | |
| JP | 09-181325 | | 7/1997 | |
| JP | 10-064819 | | 3/1998 | |
| JP | 10-074697 | | 3/1998 | |
| JP | 10-092745 | | 4/1998 | |
| JP | 11-016866 | | 1/1999 | |
| JP | 11-177098 | | 7/1999 | |
| JP | 11-354801 | | 12/1999 | |

OTHER PUBLICATIONS

Kuriyama et al., "Lateral Grain Growth of Poly–Si Films with a Specification Orientation by an Excimer Laser Annealing Method", *Jpn. J. Appln. Phys.*, vol. 32, (1993) pp. 6190–6195.

Suga et al., "The Effect of a Laser Annealing Ambient on the Morphology and TFT Performance of Poly–Si Films", *SID 00 Digest*, pp. 534–537 (2000).

"99 Updated Liquid Crystal Process Technology" (1999), pp. 53–58 (English translation of portions of pp. 54 and 55).

* cited by examiner

Primary Examiner—Eddie Lee
Assistant Examiner—José R. Díaz
(74) Attorney, Agent, or Firm—Antonelli, Terry, Stout & Kraus, LLP

(57) ABSTRACT

Disclosed is a polysilicon film adapted for use in a liquid crystal display, and method of manufacturing such film. In manufacturing the film, a native oxide layer formed on a surface of an amorphous silicon film is completely removed by a hydrofluoric acid solution, followed by immersing in an $H_2O_2$ solution to newly form an extremely thin oxide layer, prior to a crystallizing processing performed by a laser beam irradiation. The crystallizing processing forms a polysilicon film formed of crystal grains Preferentially oriented on the (111) plane in a direction parallel to the substrate surface, an average crystal grain size being not larger than 300 nm, the standard deviation of the grain sizes being not larger than 30% of the average grain size, and the standard deviation of the roughness being not larger than 10% of the average grain size.

3 Claims, 16 Drawing Sheets

PLAN VIEW

CROSS SECTIONAL VIEW

LIQUID CRYSTAL DISPLAY ELEMENT AND METHOD OF MANUFACTURING THE SAME

This application claims a priority based on Japanese Patent Application No. 2000-295425 filed on Sep. 25, 2000, the entire contents of which are incorporated herein by reference for all purposes.

BACKGROUND OF THE INVENTION

The present invention relates to a thin film semiconductor element for a liquid crystal display, particularly to a thin film transistor element for a liquid crystal display using crystalline silicon by a low temperature processing and a method of manufacturing the same.

In recent years, a liquid crystal display panel using a thin film transistor element of amorphous silicon is widely used as a display device in a personal computer, an information terminal equipment and the like.

However, it has been desired to develop a thin film transistor element capable of a high speed driving in accordance with an improved fineness of a display device and a rapid processing of an increasing amount of information.

Such a thin film transistor element is described in, for example, (1) "'99 Updated Liquid Crystal Process Technology, published by Nikkei Business Publications Inc., 1999, page 54". It is described that an amorphous silicon film is formed on a glass substrate by a PE-CVD method (Plasma Enhancement-Chemical Vapor Deposition Method), followed by performing a dehydrogenation annealing processing on the amorphous silicon film. Then, after boron atoms are added to a channel region, an excimer laser annealing processing is performed so as to polycrystallize the amorphous silicon film, thereby forming a thin film transistor element or crystalline silicon.

It is also reported in, for example, (2) Japanese Patent Laid-Open No. Hei 11(1999)-354801 gazette that an amorphous silicon film is immersed with a solution containing ozone so as to form an oxide film on the surface of the amorphous silicon film, followed by removing the oxide film by using a hydrofluoric acid solution and subsequently performing a laser annealing so as to crystallize the amorphous silicon film.

It is also reported in, for example, (3) Japanese Patent Laid-Open No. Hei 11(1999)-16866 gazette that, after a native oxide film of an amorphous silicon film is removed by a wet etching, an oxide film is formed on the surface of the amorphous silicon film by immersing the amorphous silicon film with an aqueous ozone solution or an aqueous hydrogen peroxide solution, followed by performing a laser annealing so as to crystallize the amorphous silicon film.

Further, a semiconductor device and a method of manufacturing the same are described in, for example, (4) Japanese Patent Laid-Open No. Hei 10(1998)-64819 gazette. It is described that, in forming an amorphous silicon film on a substrate, a metal for selectively fostering the crystallization is added so as to promote the crystal growth in a predetermined crystal growing direction, thereby forming a crystalline silicon film.

It should be noted in the thin film transistor element using the conventional crystalline silicon film described above that, in general, a silicon film is a polycrystalline silicon (polysilicon) film. In the polysilicon film, there is a close relationship between the crystal grain size (diameter) and the electron mobility. Specifically, the electron mobility is decreased with decrease in the crystal grain size. One of the causes of the particular relationship is considered to reside in that carriers migrating within the polysilicon film, i.e., electrons, are scattered in the grain boundary present in the polysilicon film.

It is generally said that, in the case where the polysilicon film is formed by performing the laser annealing processing to an amorphous silicon film, a sufficient crystal growth cannot be achieved when an irradiation energy density of a laser beam is low, with the result that the crystal grains of the formed polysilicon have a size not larger than 100 nm in many cases.

In the case of employing prior art (1) described above, it is possible to form crystal grains having a grain size not smaller than 100 nm by increasing the energy density of the laser beam used for irradiating the amorphous silicon film. In this case, however, the nonuniformity in the crystal grain sizes is Increased with increase of the crystal grain size, causing a problem that nonuniformity in the electric characteristics is generated in the formed polysilicon film.

It should also be noted that, where a polysilicon film is grown by employing a laser annealing method, a serious problem is generated in the manufacturing process that abnormal protrusions not smaller than 50 nm from the crystal grain boundary are generated.

Moreover, in the above described prior art (2), it is possible to prevent the protrusion of the crystal relating to the crystal grain boundary and derived from the laser annealing processing by a performing the laser annealing processing after the oxide film is removed by using the aqueous hydrofluoric acid solution. In an ordinary case, it is necessary to carry out the cleaning processing with, for example, pure water or the like after the processing with the aqueous hydrofluoric acid solution.

However, since the amorphous silicon surface after removal of the surface oxide film exhibits the hydrophobic, fine water droplets not larger than several micrometers remain on the surface of the: amorphous silicon after the cleaning processing. And then, these water droplets cause silicon atoms to elute out of the surface of the amorphous silicon so as to form protrusions not smaller than at least 50 nm.

Since these protrusions remain as they are even after the laser annealing processing to form polysilicon, these protrusions cause a defocusing in a subsequent photolithography step, with the result that the reliability of the insulating film laminated on the polysilicon film is impaired due to an insulation defective or the like.

Prior art (3) described above shows that an oxide film having a thickness of 1 to 3 nm is formed on the amorphous silicon film by using an aqueous ozone water or an aqueous hydrogen peroxide water, followed by drying the oxide film and subsequently performing the laser annealing processing to the dried oxide film. However, since the oxide film formed on the surface has a large thickness, a serious problem has been generated that abnormal protrusions not smaller than 50 nm from the crystal grain boundary were generated even if the laser annealing was directly performed to the amorphous silicon to form a polysilicon film.

Furthermore, in prior art (4) described above, it is possible to form the polysilicon film of a (111) plane orientation exhibiting high mobility characteristics by the addition of the metal to foster the crystallization. However, in the method described in this prior art, an additional step of adding the metal is required so as to make the manufacturing process more complex. In addition, in the crystal growing process carried out under a low temperature, i.e., not higher than 450° C., the crystal growing rate becomes markedly low in general, leading to a low productivity. This is a serious problem in view of the social demands for realization of a liquid crystal display using the polysilicon thin film transistor.

SUMMARY OF THE INVENTION

The contents given below are not described in the aforementioned prior arts.

An object of the present invention is to provide a polysilicon film for a liquid crystal display, which has a low nonuniformity of a crystal size, suppresses occurrence of the protrusion on the surface, exhibits a preferred (111) plane orientation, and has a high electron motility.

The purpose of the present invention can be achieved by preparing a thin film consisting of an aggregate of crystal grains preferentially oriented on the (111) plane that is parallel to the substrate surface, and by forming a thin film Si, Ge or SiGe semiconductor element, in which the crystal grains have an average crystal grain size not larger than 300 nm on the surface of the thin film.

It is possible to utilize, for example, an X-ray diffraction intensity ratio of the crystal surface as an index of the preferred orientation. The purpose of the present invention can be achieved by setting the X-ray diffraction intensity ratio I(111)/I(220) in the (111) plane and the (220) plane, when measuring the X-ray diffraction on the plane parallel to the substrate surface, at 30 or more.

Also, it is possible to suppress the variation in the characteristics of the crystal grains so as to obtain a stable crystal grain boundary by setting the standard deviation of the grain diameters of the crystal grains at 30% or less of the average grain size.

Also, it is possible to form a polysilicon thin film, in which the formation of protrusions at the crystal grain boundary is suppressed, by setting the standard deviation of the surface roughness at 10% or less of the average grain size.

Further, it is possible to obtain a polysilicon thin film low in protrusion occurrence in the crystal grain boundary by forming an aggregate of columnar crystals oriented on the approximate (111) plane in a direction parallel to the substrate surface.

A polysilicon thin film transistor having a high electron mobility and applied for the liquid crystal display can be achieved by setting the average electron mobility of the polysilicon thin film of the present invention described above at 200 $cm^2/v$'s or more, by constituting the thin film described above with an aggregate of crystal grains preferentially oriented on the (111) plane in a direction parallel to the substrate surface, and by setting the average crystal grain diameter of the crystal grains on the surface of the thin film at 2% or more of a channel length of the transistor.

It is possible to form a crystalline semiconductor thin film applied for the liquid crystal display, in which the protrusion occurrence on the surface can be suppressed in spite of the high crystallinity, by forming an amorphous semiconductor thin film on the substrate, by controlling the thickness of the oxide film formed on the thin film to fall within a range not less than 0.1 nm and not more than 0.4 nm, and further by annealing the amorphous thin film by a laser beam irradiation so as to crystallize partially or entirely the amorphous thin film, The thickness of the oxide film can be controlled to fall within a range of 0.1 nm and 0.4 nm by immersing the amorphous semiconductor thin film in a solution containing HF and, further, in an aqueous solution containing $H_2O_2$.

Further, the purpose of the present invention can be achieved by removing the oxide film formed on the surface of the amorphous semiconductor thin film by immersing the amorphous semiconductor thin film in the aqueous solution containing at least HF, and further by irradiating the semiconductor thin film with a ultraviolet (UV) light under an ambient containing oxygen or by immersing the semiconductor thin film in the aqueous ozone solution.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF PREFERRED EMBODIMENTS

The embodiments of the present invention will be described in detail with reference to the accompanying drawings, with silicon taken as an example.

Figure 1A:
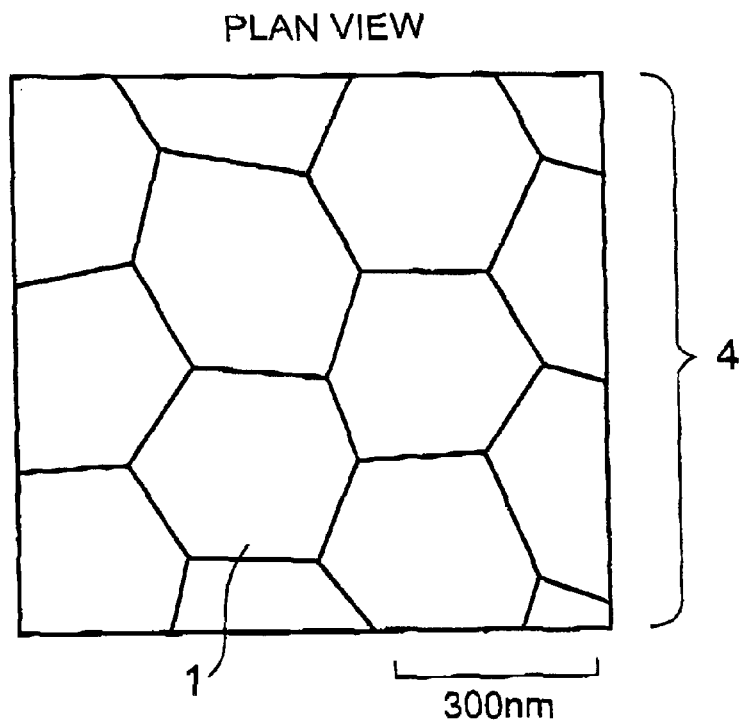
FIG. 1A is a plan view showing a polysilicon thin film for explaining embodiment 1.
Figure 1B:
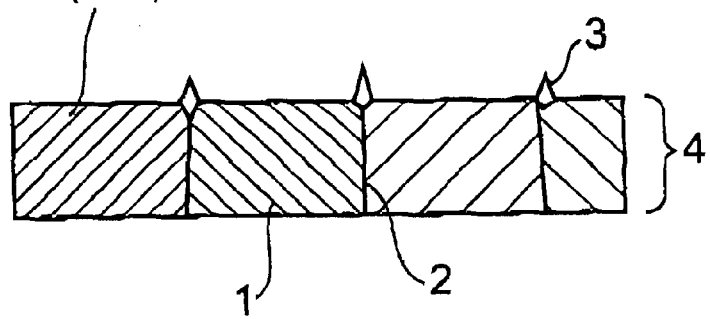
FIG. 1B is a cross sectional view of the polysilicon thin film for explaining Embodiment 1.

FIG. 1A is a plan view of a polysilicon thin film for explaining Embodiment 1, and FIG. 1B is a cross sectional view of the polysilicon thin film shown in FIG. 1A. Polygonal island regions shown in FIG. 1A are formed by polysilicon grains 1 preferentially oriented on the (111) plane relative to the substrate surface. Growing conditions of the polysilicon thin film described later are controlled to allow the average grain size of the polysilicon to be not larger than 300 nm and to allow the standard deviation of the average grain size to be not larger than 30% of the average grain size.

As shown in FIG. 1B, a polysilicon thin film 4 is an aggregate of the columnar polysilicon grains 1. A protrusion 3 is formed in the overlapping region of the polysilicon grains 1, i.e., in the crystal grain boundary 2. The standard deviation of the surface roughness of the polysilicon thin film 4 including the projections 3 is controlled to be not larger than 10% of the average grain size of the polysilicon grains 1.

Figure 2:
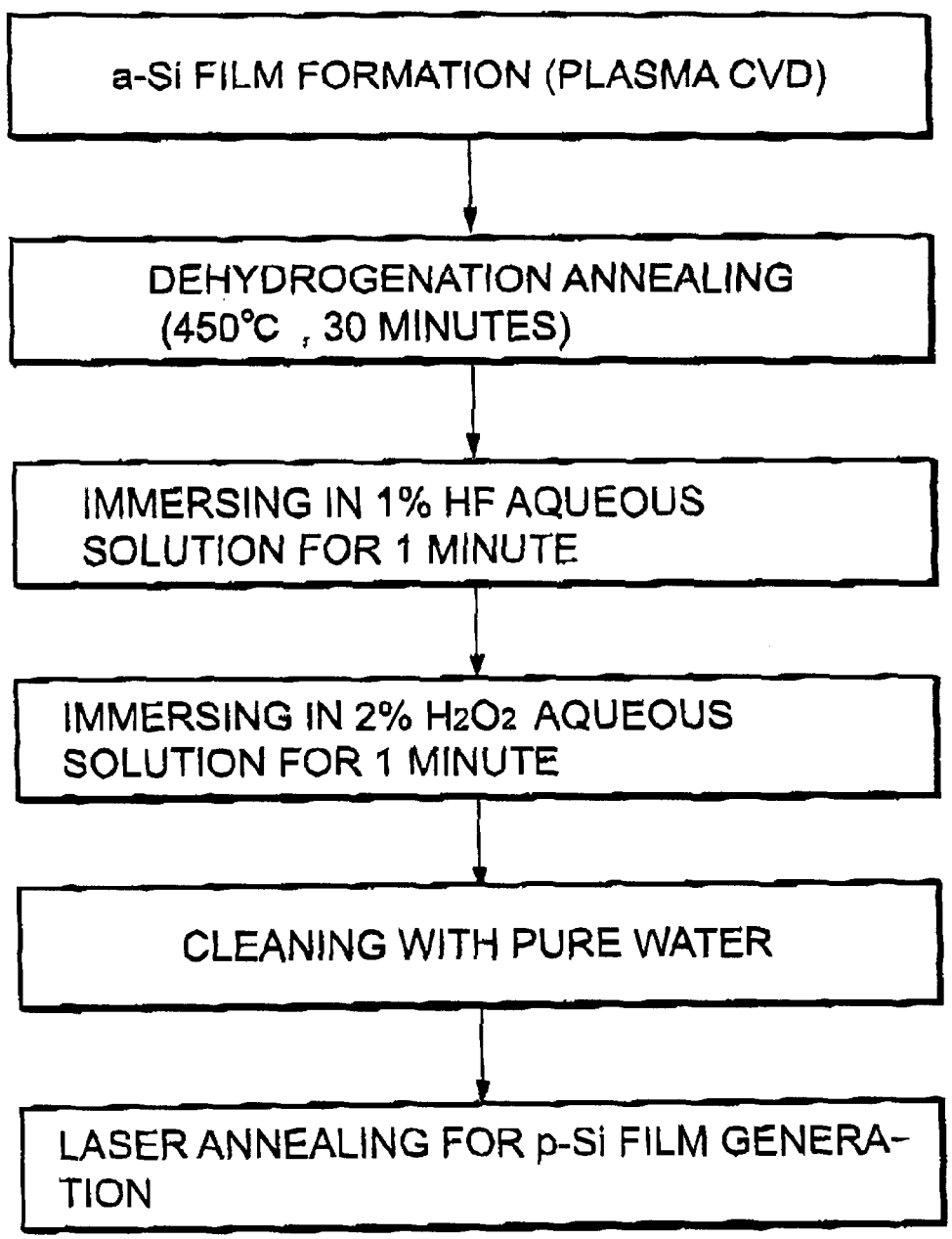
FIG. 2 is a process flow chart for forming then polysilicon thin film of embodiment 1.

FIG. 2 schematically shows a process for forming the polysilicon thin film 4 of embodiment 1 described above.

In Embodiment 1, a Corning 7059 glass was used as an example of the substrate. An amorphous silicon film having a thickness of 50 nm is formed on the glass substrate by employing a plasma CVD method widely known to the art, Then, the substrate is set in a furnace in which the temperature of the ambient is controlled at, for example, 450° C., and an annealing processing is performed for about, for example, 30 minutes so as to carry out the dehydrogenation processing of the amorphous silicon film.

After the annealing processing, the substrate is immersed in an aqueous hydrofluoric acid having a concentration of about 1% for about one minute to remove completely the native oxide film formed on the surface of the amorphous silicon film.

In the ordinary silicon wafer-based process, the cleaning processing with the pure water is carried out in this step in many cases. However, since the surface of the amorphous silicon exhibits the hydrophobic, water droplets not larger than several micrometers are generated on the surface of the amorphous silicon film by washing with pure water. As a result, protrusions derived from the water droplets may be generated in the process of forming a polysilicon thin film, as the problem occurred in prior art (2).

Therefore, the substrate was subsequently immersed in, for example, an aqueous solution containing about 2% of $H_2O_2$ in embodiment 1 after the processing with the aqueous hydrofluoric acid solution so as to newly form an extremely thin oxide film on the surface of the amorphous silicon film, thereby changing the hydrophobic surface into a hydrophilic surface. Then, the ordinary cleaning processing with the pure water was carried out.

Figure 3:
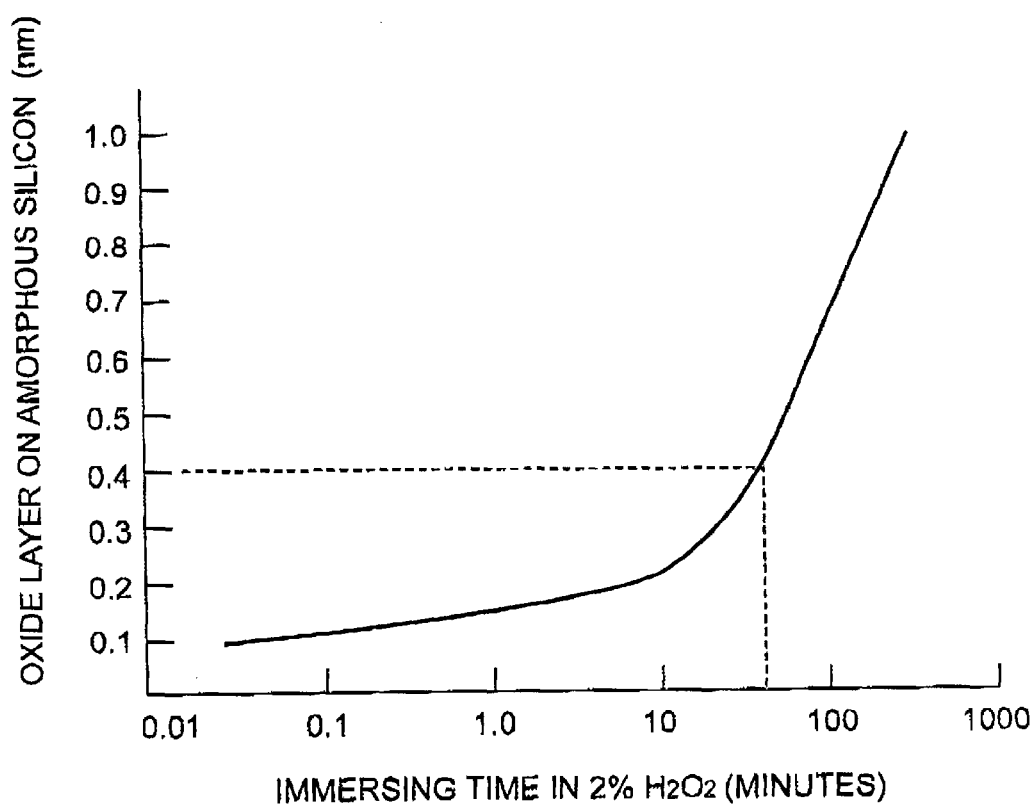
FIG. 3 is a graph showing a relationship between the immersing time in an $H_2O_2$ solution and the thickness of the oxide film formed on an amorphous silicon film.

Herein, FIG. 3 shows a graph of the relationship between the immersing time in the solution containing about 2% of $H_2O_2$ and the thickness of the oxide film formed oh the surface of the amorphous silicon film. Note that the thickness of the formed oxide film was measured by using a spectroscopic "ellipsometry" that is widely known to the art.

As a result, it has been found that, immediately after the amorphous silicon film forced by the ordinary plasma CVD method is exposed to the atmosphere, a native oxide layer is formed on the surface in a thickness of about 1 to 2 nm. Since the native oxide can be removed completely by immersing the substrate in the aqueous solution containing about 1% of hydrofluoric acid for about one minute, the oxide layer does not exist on the amorphous silicon film any more.

As apparent from FIG. 3, the new oxide layer formed on the amorphous silicon film is gradually grown with increase in the immersed time in the $H_2O_2$ solution. To be more specific, the thickness of the surface oxide is increased to reach about 0.1 to 0.4 nm by the immersing for about 0.1 to 30 minutes at room temperature.

It has been confirmed by a well-known microscopic observation that, even if the thickness of the surface oxide film is within the range described above, the surface maintains sufficient hydrophilicity, with the result that water droplets do not remain on the surface even if processing with the pure water is performed in the subsequent step.

In the next step, the amorphous silicon film having an oxidization processing to form the extremely thin surface oxide film performed thereto was irradiated with an XeCl laser having a wavelength of 308 nm so as to crystallize the amorphous silicon film, thereby forming the polysilicon thin film, as shown in FIG. 2. Incidentally, in embodiment 1, the energy density of the laser beam was set at 300 to 500 mJ/cm².

Figure 4:
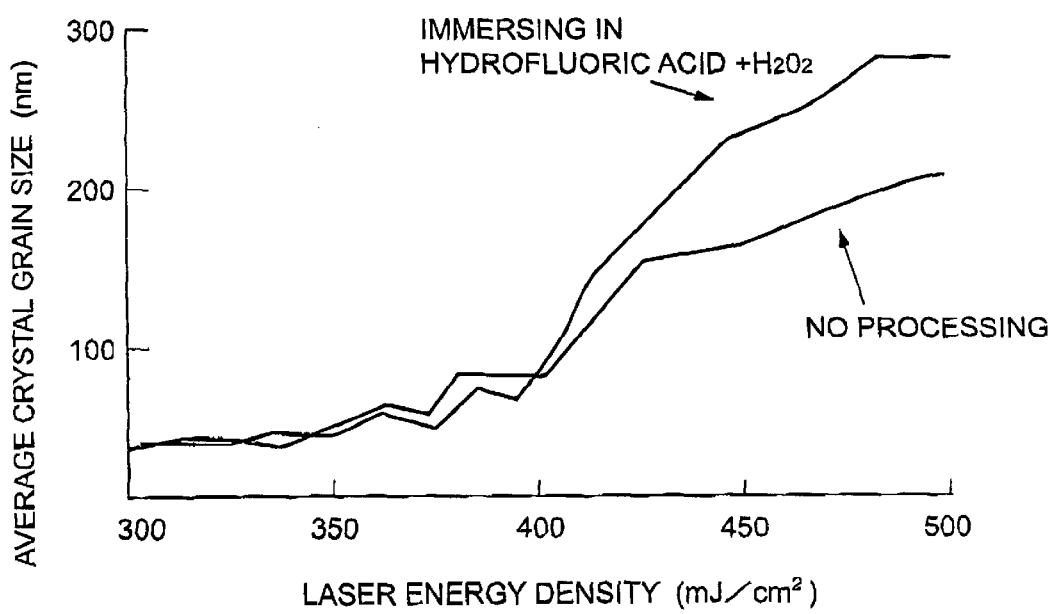
FIG. 4 is a graph showing the relationship between the average crystal grain size of the polysilicon thin film and the energy density or the laser beam used for crystallization in respect of embodiment 1.

FIG. 4 is a graph showing the relationship between the crystal grain size and the energy density of the laser beam used for irradiation in respect of the polysilicon thin film fabricated according to the process shown in FIG. 2. The crystal grain size was measured by an SEM (Scanning Electron Microscopy) observation method.

Herein, a long axis and a short axis of the crystal grain were measured by the SEM observation method, and the average value of the long axis and the short axis thus measured was defined as the crystal grain size. Also, for determining the average crystal grain size, the grain sizes of all the crystal grains observed within an area of 10 μm×10 μm were measured and the average value thereof was defined as the average crystal grain size.

As apparent from FIG. 4, the average crystal grain diameter tends to increase with increase in the energy density of the laser beam used for irradiation on the amorphous silicon film. As a result of examination in detail, the average crystal grain size is less than 100 nm in the case where the energy density of the laser beam is not higher than 400 mJ/cm$^2$. However, the crystal grain size begins to be markedly increased with increase in the energy density of the laser beam in the case where the energy density of the laser beam exceeds 400 mJ/cm$^2$.

If the laser beam used for the irradiation has the same energy density, the diameter of the formed crystal grain is markedly changed depending on the situation as to whether or not the surface treatment was performed before the laser beam irradiation. To be more specific, the crystal grain size of the formed polysilicon thin film is markedly increased in the case where the washing with the pure water is performed after the surface of the amorphous silicon film is immersed in the 1% hydrofluoric acid solution for one minute and, then, in the 2% $H_2O_2$ solution for one minute and before the laser annealing in embodiment 1 is performed. In this case, the average crystal grain diameter was found to be about 278 nm relative to the energy density of 500 mJ/cm$^2$.

Note that the average crystal grain diameter was found to be 220 nm (not shown) in the case where the washing with the pure water was performed after the immersing in the $H_2O_2$ solution for 100 minutes as a comparative example, the average crystal grain size was found to be about 239 nm (not shown) in the case where the cleaning with the pure water was performed after the immersing in the hydrofluoric acid solution, and the average crystal grain size was found to be 204 nm in the case where the immersing in the hydrofluoric acid solution was not carried out before the annealing processing with the laser beam.

It is considered reasonable to interpret the results given above to the effect that it is possible to obtain a very clean surface state by completely removing temporarily the native oxide formed on the surface of an amorphous silicon film, followed by newly covering the surface of the amorphous silicon film with the extremely thin oxide layer, and thereby it is possible to suppress the abnormal crystal growth that occurs in the subsequent annealing processing with a laser beam.

Figure 5:
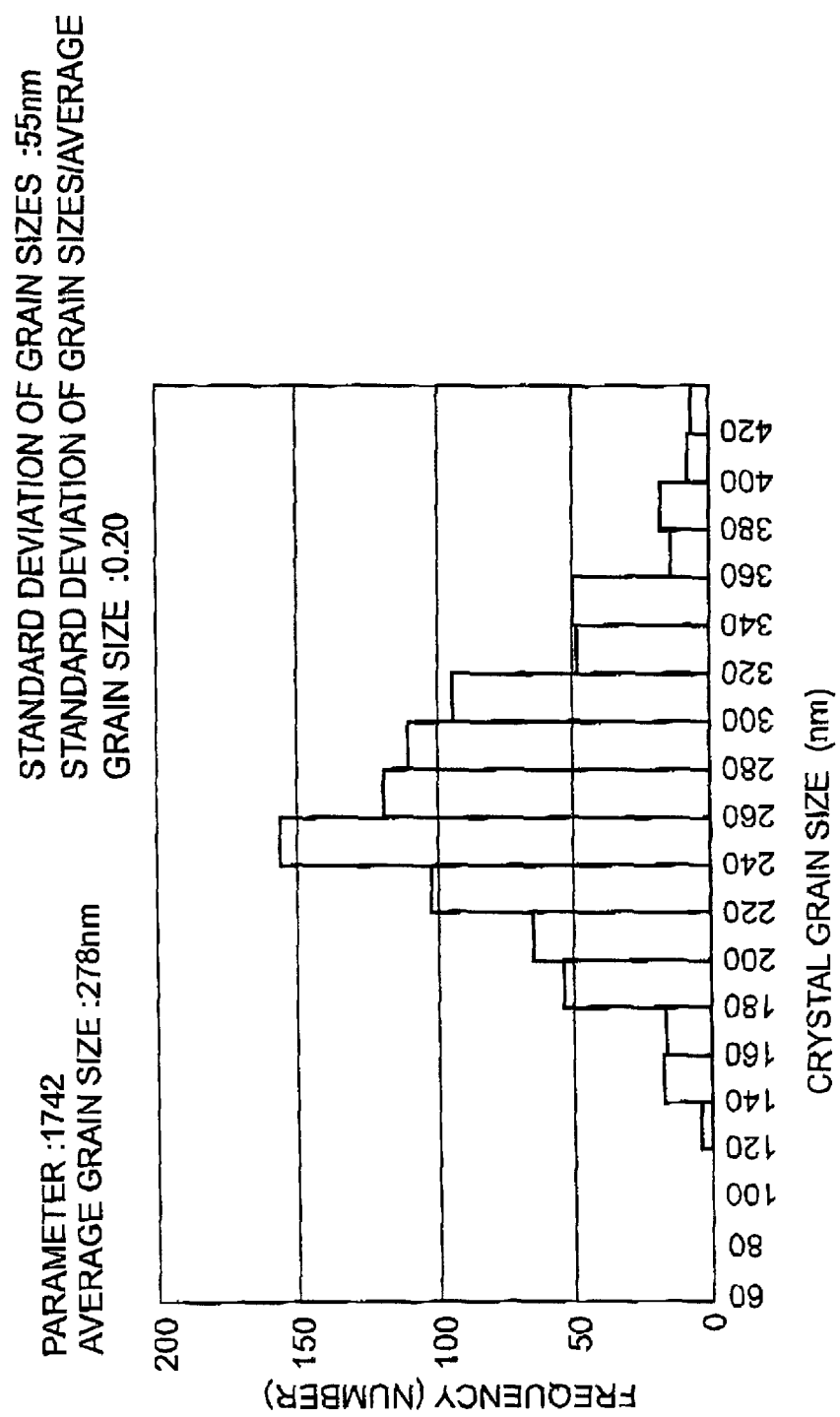
FIG. 5 is a graph showing a nonuniformity in the, crystal grain sizes in the case where the amorphous silicon film of the polysilicon thin film of embodiment 1 was immersed in a 1% aqueous solution of hydrofluoric acid for one minute and, then, in a 2% $H_2O_2$ solution for one minute before the crystallization processing.
Figure 6:
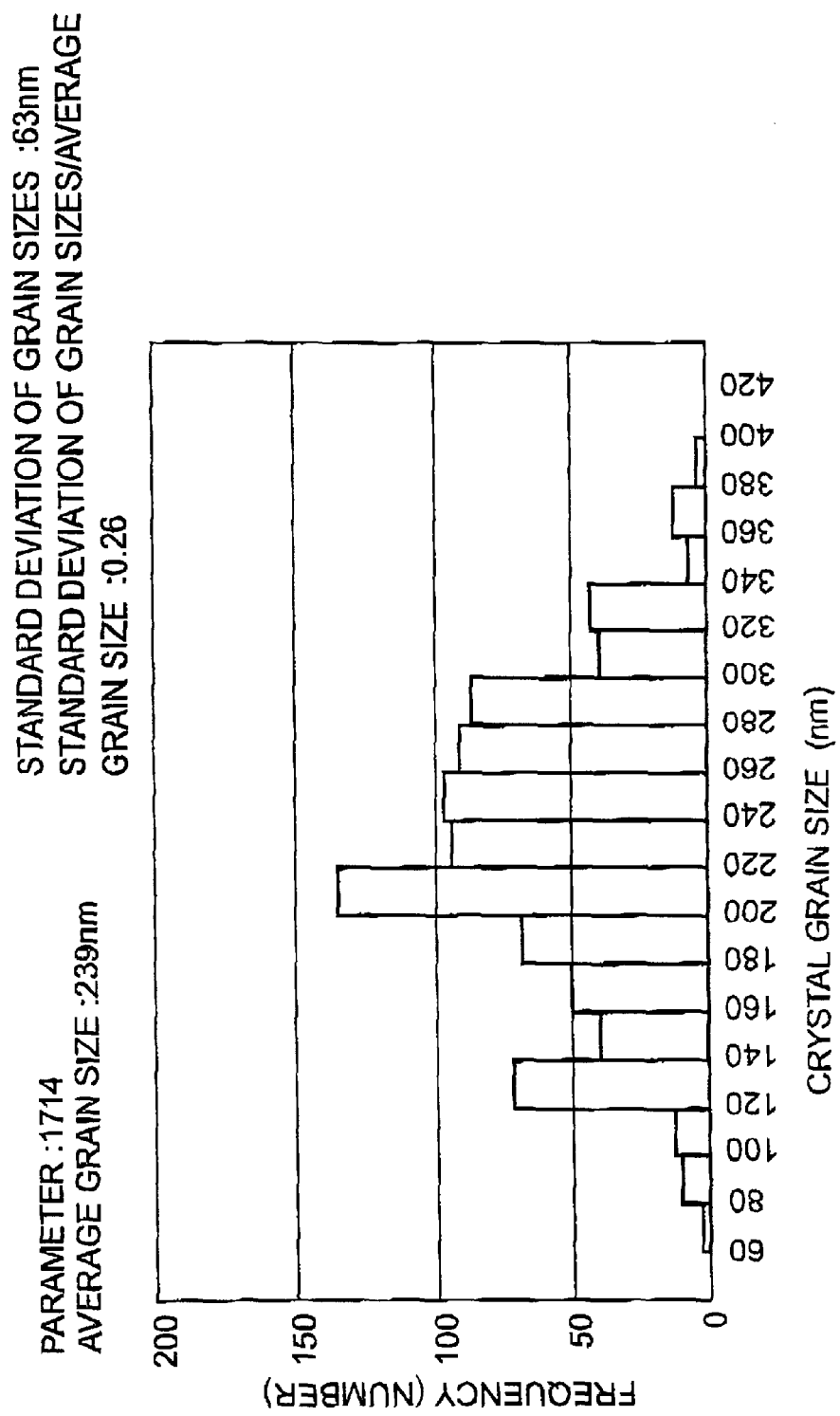
FIG. 6 is a graph showing a nonuniformity in the crystal grain sizes in the case where the amorphous silicon film of the polysilicon thin film of embodiment 1 was immersed in the 1% aqueous solution of hydrofluoric acid for one minute before the crystallization processing.
Figure 7:
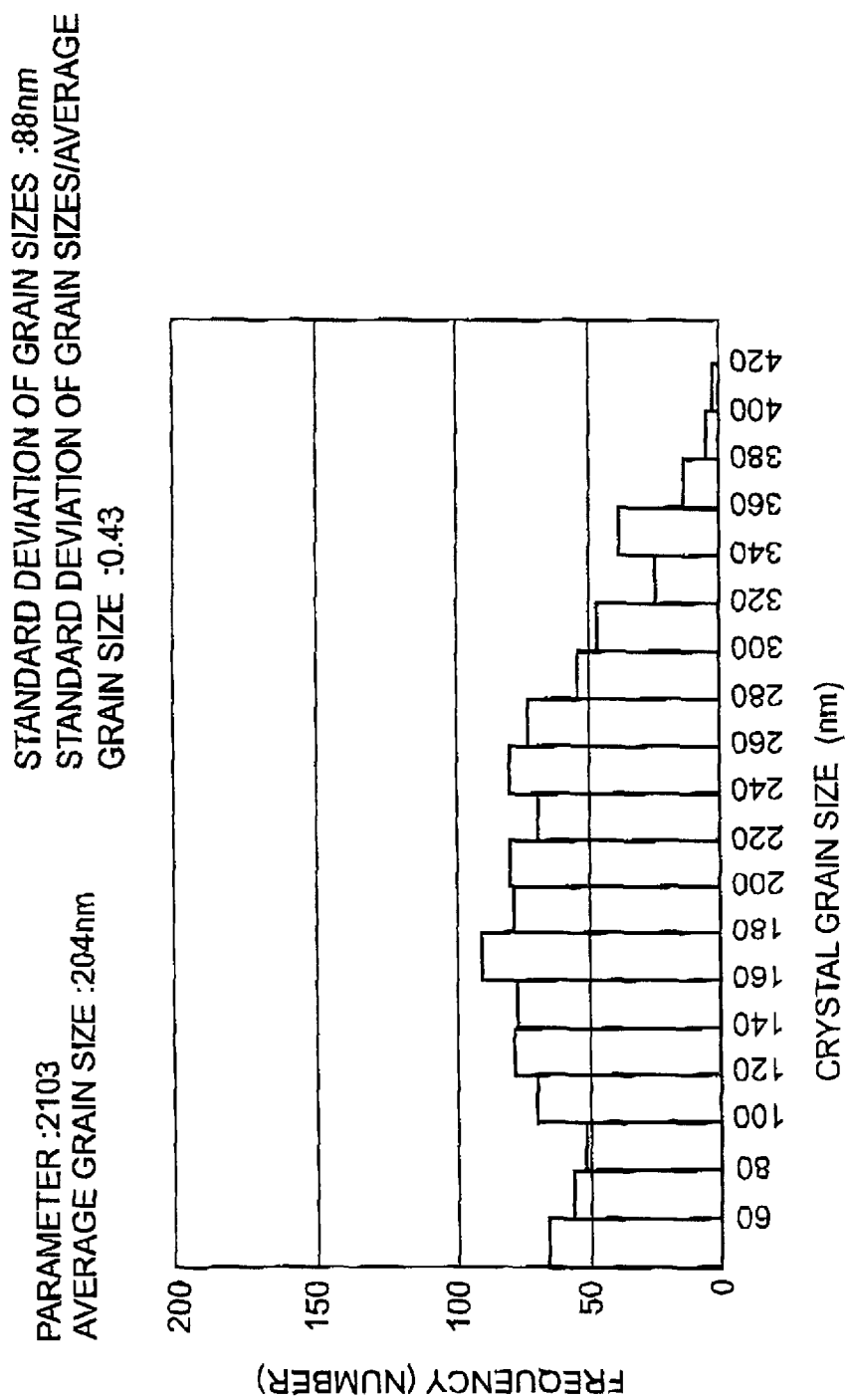
FIG. 7 is a graph showing a nonuniformity in the crystal grain sizes in the case where the amorphous silicon film of the polysilicon thin film of embodiment 1 was not subjected to washing processing before the crystallization processing.
Figure 8:
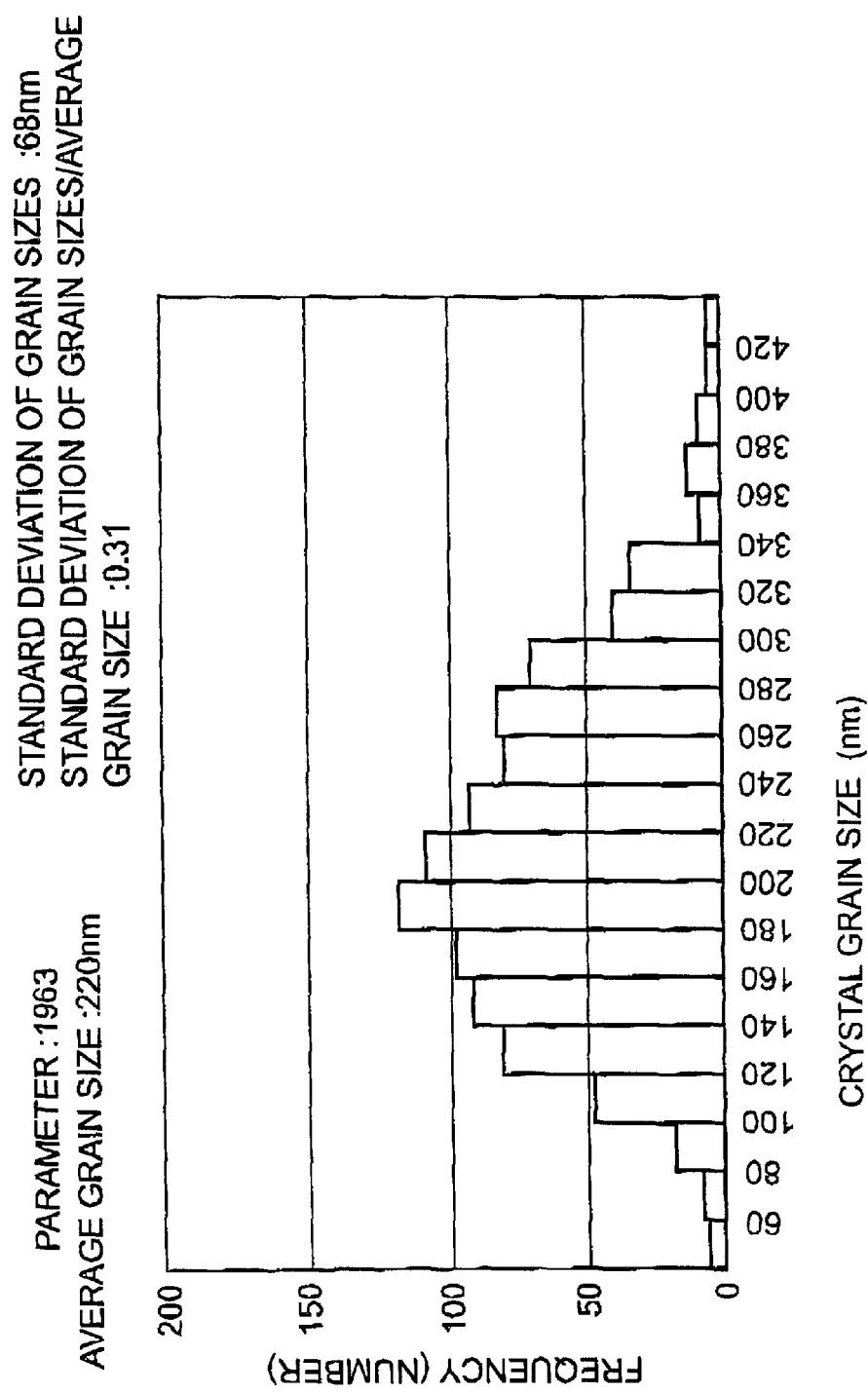
FIG. 8 is a graph showing a nonuniformity in the crystal grain sizes in the case where the amorphous silicon film of the polysilicon thin film of embodiment 1 was immersed in the 1% aqueous solution of hydrofluoric acid for one minute and, then, in the 2% $H_2O_2$ solution for 100 minutes before the crystallization processing.

Each of FIGS. 5, 6, 7 and 8 shows the nonuniformity in the crystal grain sizes in the case where the energy density of the laser beam used for the irradiation was 500 mJ/cm$^2$. Herein, FIG. 5 shows the case where the substrate was immersed in the 1% hydrofluoric acid solution for one minute and, then, in the 2% $H_2O_2$ solution for one minute before the laser annealing processing. FIG. 6 shows the case where the substrate was simply immersed in the 1% hydrofluoric acid solution for one minute. FIG. 7 shows the case where even the immersing in a hydrofluoric acid solution was not carried out. Further, FIG. 8 shows the case where the substrate was immersed in the 1% hydrofluoric acid solution for one minute and, then, in the 2% $H_2O_2$ solution for 100 minutes. In other words, FIG. 8 shows the case where a quite thick oxide film (about 2 to 3 nm) was intentionally formed on the surface of the amorphous silicon film.

The results clearly indicate that, where the substrate was immersed in the hydrofluoric acid solution, and then, in the 2% $H_2O_2$ solution for one minute before the laser annealing processing, it was, possible to obtain the lowest nonuniformity of the: crystal grain sizes. To be more specific, the standard deviation of the crystal grain sizes was found to be about 55 nm, in contrast to about 63 nm, where only the immersing in the hydrofluoric acid solution was carried out, about 88 nm, where the immersing processing was not carried out at all, and about 68 nm, where a quite thick oxide film was formed by performing the immersing processing in the hydrofluoric acid solution and in the 2% $H_2O_2$ solution for 100 minutes. Clearly, it is possible to form far more uniform crystal grains in the case of the present invention, compared with the other cases.

Note that the standard deviation used herein represents δ used in a statistical analysis by a normal distribution.

Further, as an indication of quantity of polysilicon, used was an index denoting the nonuniformity of the grain sizes relative to the average crystal grain size.

Specifically, the index was defined as: A=B/C, where A denotes the index (%) for the nonuniformity of the crystal grain sizes, B denotes the standard deviation of the crystal grain sizes, and C denotes the average crystal grain size.

As a result, embodiment 1 of the present invention, in which the dipping in the hydrofluoric acid solution and in the $H_2O_2$ solution for one minute was performed, was found to be superior in the particular index to the other cases. Specifically, the index was found to be 20%, which is markedly smaller than the case where the dipping in the hydrofluoric acid alone was performed (index: about 26%), the case where the dipping processing was not performed at all (index: about 43%), and the case where the dipping in the hydrofluoric acid and the dipping in a $H_2O_2$ solution for 100 minutes were performed (index: about 31%). In other words, the crystallization method of embodiment 1 can be said to be highly effective in the case of forming an aggregate of crystal grains having uniform grain sizes.

What is the most important for producing the desired effects in the series of the experimental data given in FIGS. 5 to 8, is that the native oxide layer formed on the surface of the amorphous silicon film is removed completely and the newly formed oxide has a reasonable thickness.

In general, in performing a crystal growth by a laser annealing, the amorphous silicon film is partially melted first, and a nucleus of the crystal growth is generated at the interface between the solid phase and the liquid phase. The crystal growth is promoted around the nucleus thus formed. However, when the oxide layer present on the surface of the amorphous film is unduly thick, the surface oxide film itself forms a part of the nucleus of the crystal growth, which rather tends to obstruct the crystal growth.

It is possible to lower the probability of generating the crystal nucleus at the surface oxide film by controlling the thickness of the oxide layer covering the surface of the amorphous silicon film to 1 to 2 atomic layer level as in embodiment 1.

It is considered reasonable to understand that the crystal growth is promoted by lowering the generation probability of the crystal nucleus at the surface so as to make it possible to form crystal grains having a large average crystal grain size and small standard deviation and small index thereof.

Figure 9:
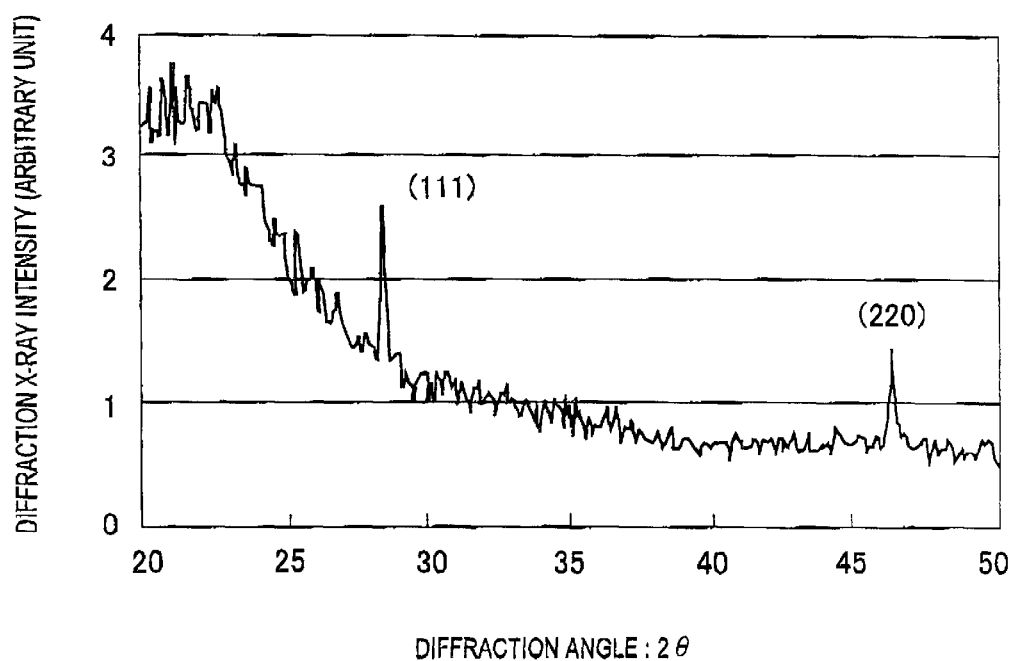
FIG. 9 shows a result of the X-ray diffraction measurement in respect of the polysilicon thin film of embodiment 1.

FIG. 9 shows the result of the X-ray diffraction measurement of the polysilicon film formed according to the process shown in FIG. 3. The diffraction pattern of FIG. 9 shows the case where the crystallization was performed by irradiation with an energy density of 300 mJ/cm$^2$, Under this condition of the energy density of the irradiation, the crystals do not grow to have a sufficiently large crystal grain size as shown in FIG. 4. However, two clear peaks were observed, and, they correspond to the (111) plane and the (220) plane.

Figure 10:
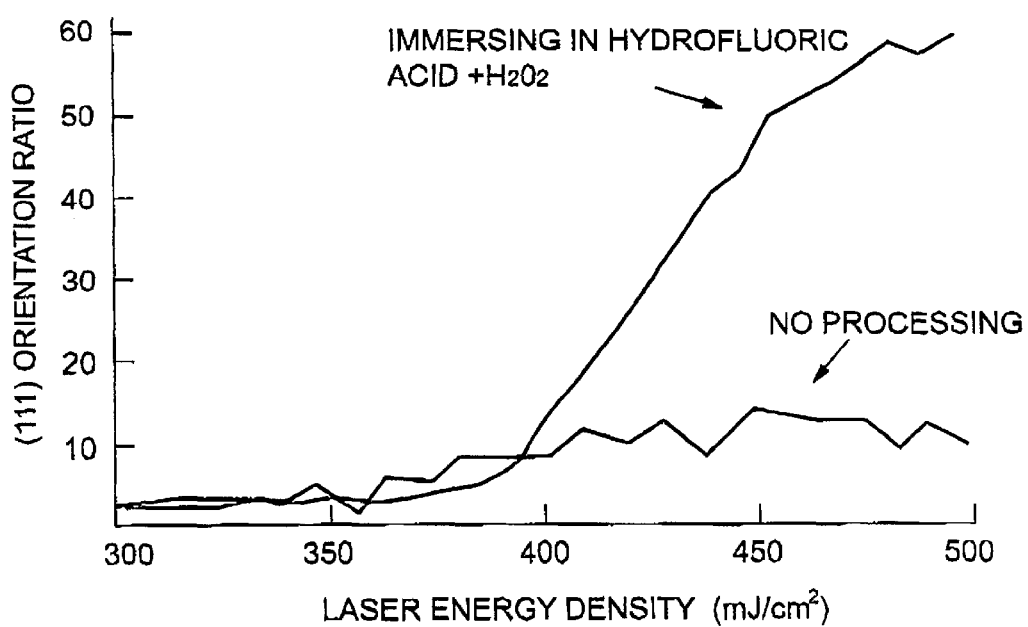
FIG. 10 is a graph showing the relationship between the (111) crystal orientation rate and the energy density of the laser beam used for the crystallization in respect of the polysilicon thin film of embodiment 1.

Accordingly, as an index showing the degree of the crystal growth, a crystal orientation rate was defined to be a ratio of (111) plane diffraction intensity/(220) plane diffraction intensity. FIG. 10 exemplifies the relationship between the crystal orientation ratio and the energy density of the irradiation.

In general, when the polysilicon film is oriented completely at random, the crystal orientation ratio is about 1.8.

The result given in FIG. 10 shows that, where the surface processing is not performed to the amorphous silicon film before the laser annealing processing, the (111) plane orientation ratio is scarcely changed even if the energy density of the laser is increased, and the value of the (111) plane orientation ratio is close to the value in the case of the random orientation.

However, it is possible to obtain a remarkable improvement in the (111) plane crystal orientation ratio in the irradiated region with an energy density of at least about, for example, 400 mJ/cm$^2$ or more by treating the surface of the amorphous silicon film before the laser annealing processing, particularly, by performing the immersing processing in the hydrofluoric acid solution and in the $H_2O_2$ solution for a short time to the surface of the amorphous silicon film before the laser annealing processing.

For example, where the dipping processing in the hydrofluoric acid solution and in the $H_2O_2$ solution for one minute is performed to the surface of the amorphous silicon film before the laser annealing processing, the orientation ratio of the polysilicon film was found to be 30 or more under a laser energy density of 430 mJ/cm$^2$ or more and found to be 60 under the laser energy density of 500 mJ/cm$^2$.

As described above, it is possible to obtain the polysilicon film having a high (111) plane orientation ratio by newly forming the oxide layer controlled to have a thickness of 1 to 2 atomic layer level on the surface of the amorphous silicon film after complete removal of the native oxide film having been formed on the surface of the amorphous silicon film, followed by carrying out the crystallization by the laser annealing through the newly formed oxide film. The reason for the capability of forming the polysilicon film having a high (111) plane orientation ratio is equal to that described previously in conjunction with the crystal grain size or its standard deviation.

Further, evaluation was performed by using an AFM (Atomic Force Microscopy) in order to look into the degree of roughness on the surface of the polysilicon film formed as described above. The measurement with the AFM was carried out by scanning an optional area (area of about 20 $\mu$m×20 $\mu$m) on the surface of the polysilicon film constituting the sample, and the standard deviation of the roughness in the measured region was used as an index of the surface texture. Also, the standard deviation represents a used in a statistical analysis on the basis that the measured values form a normal distribution.

FIGS. 11, 12, 13 and 14 show the results of the AFM measurement in respect of the shapes of the crystal surface in the case where a laser annealing processing was performed by using a laser beam having an energy density of 500 mJ/cm$^2$.

Figure 11:
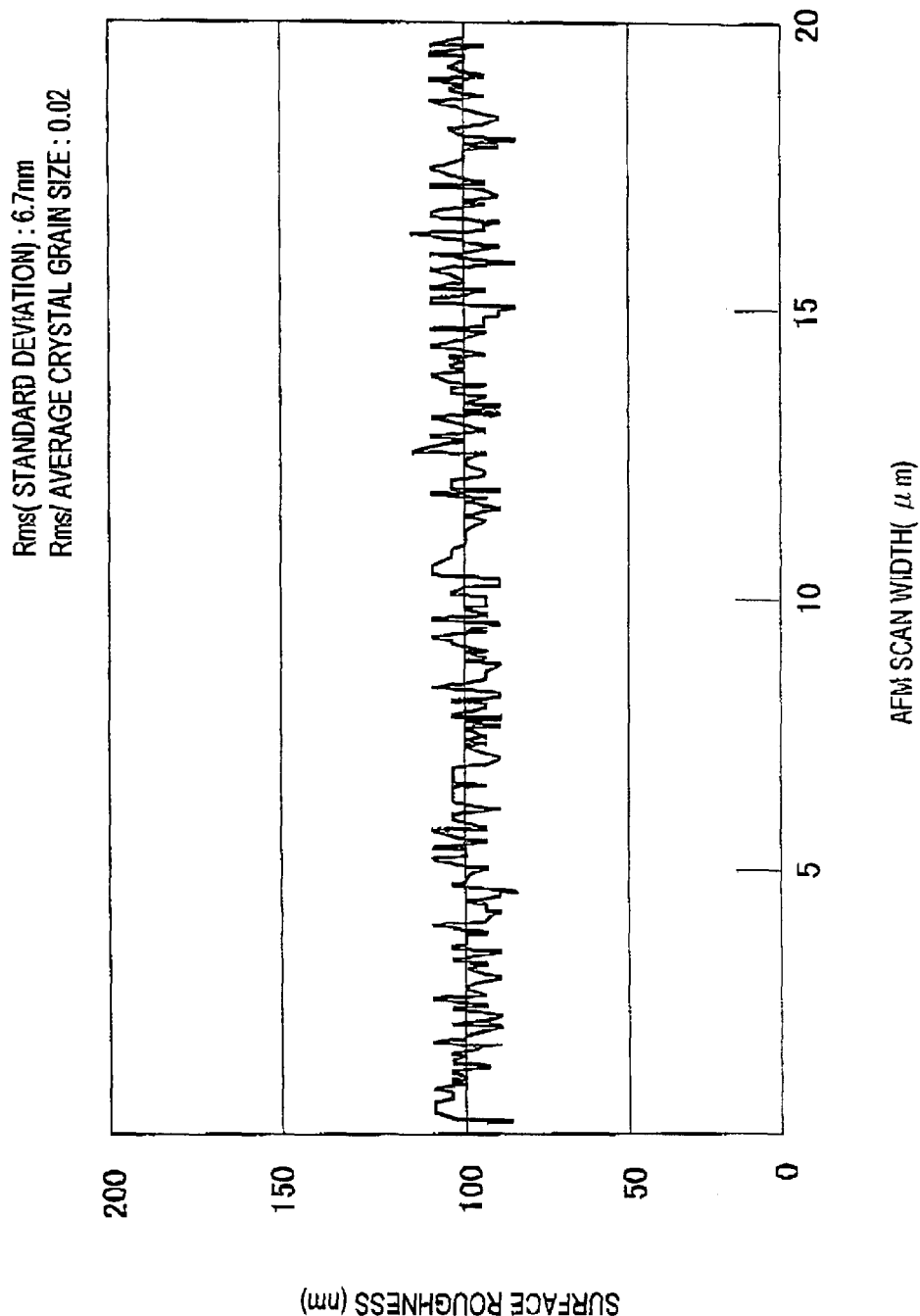
FIG. 11 shows a result of AFM measurement for explaining a morphology of the surface roughness in the case where the amorphous silicon film of the polysilicon thin film of embodiment 1 was immersed in the 1% aqueous solution of hydrofluoric acid for one minute and, then, in the 2% $H_2O_2$ solution for one minute before the crystallization processing.
Figure 12:
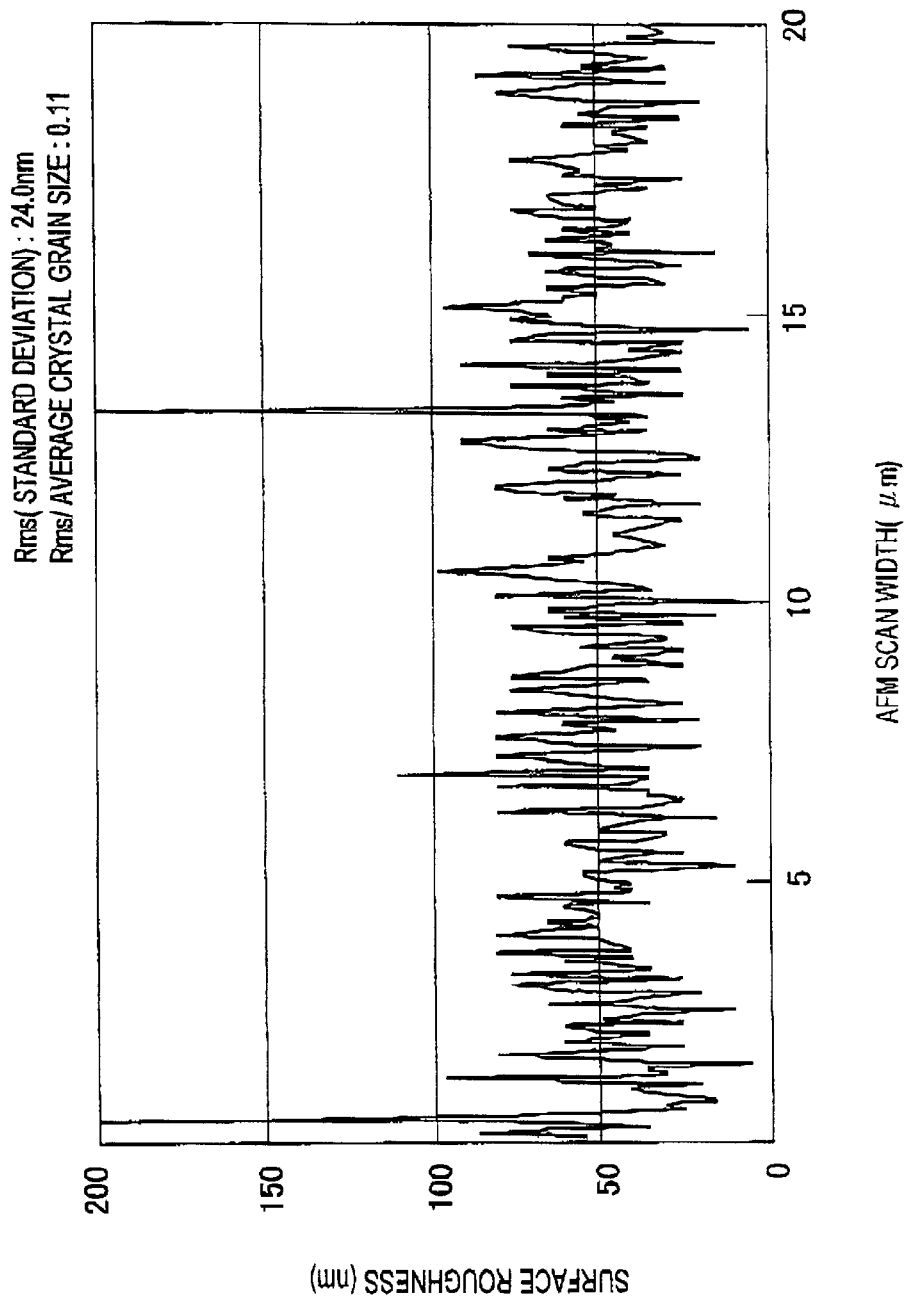
FIG. 12 shows a result of AFM measurement for explaining a morphology of the surface roughness in the case where the amorphous silicon film of the polysilicon thin film of embodiment 1 was dipped in the 1% aqueous solution of hydrofluoric acid for one minute before the crystallizing processing.
Figure 13:
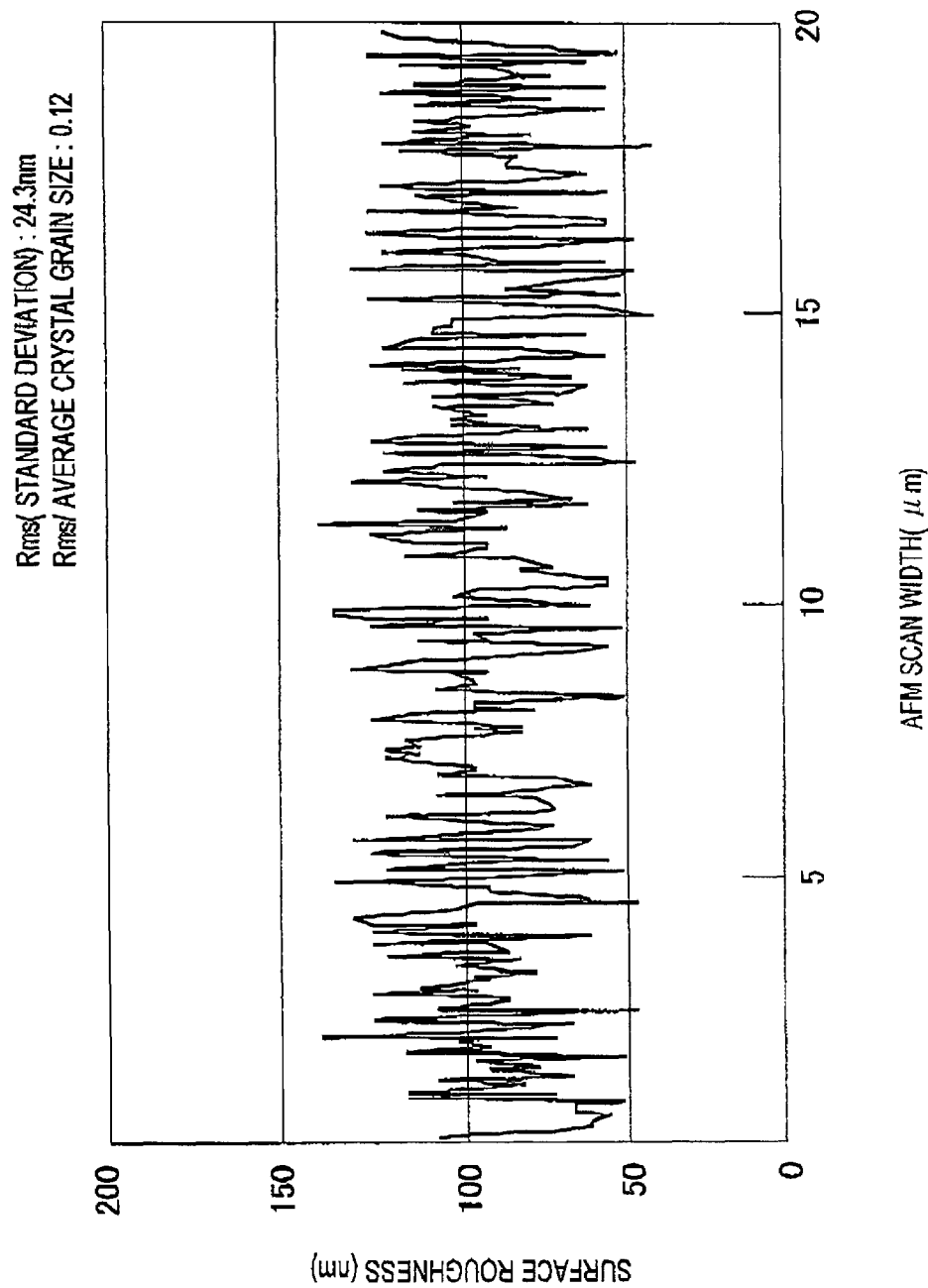
FIG. 13 shows a result of AFM measurement for explaining a state of the surface roughness in the case where the amorphous silicon film of the polysilicon thin film of embodiment 1 was not subjected to the cleaning processing before the crystallization processing.

FIG. 11 shows the case where the immersing processing in the hydrofluoric acid solution and in the 2% $H_2O_2$ solution for one minute was performed to the amorphous silicon film before the laser annealing processing (oxide film thickness of about 0.1 to 0.4 nm). FIG. 12 covers the case where the immersing processing in a hydrofluoric acid solution alone was performed. FIG. 13 covers the case where the washing processing was not performed at all. Further, FIG. 14 covers the case of performing a dipping processing in a hydrofluoric acid solution and in a 2% $H_2O_2$ solution for 100 minutes (oxide film thickness of about 2 to 3 nm). In each of the graphs shown in FIGS. 11 to 14, the scanning width of the atomic probe in the AFM measurement is plotted on the abscissa, with the degree of roughness on the crystal surface being plotted on the ordinate.

As a result, the smallest standard deviation of the roughness on the surface of the polysilicon film after the laser annealing processing was achieved in the case of the immersing processing in the hydrofluoric acid solution, and then, in the, 2% $H_2O_2$ solution for one minute shown in FIG. 11. In this case, the standard deviation was found to be 6.7 nm.

Figure 14:
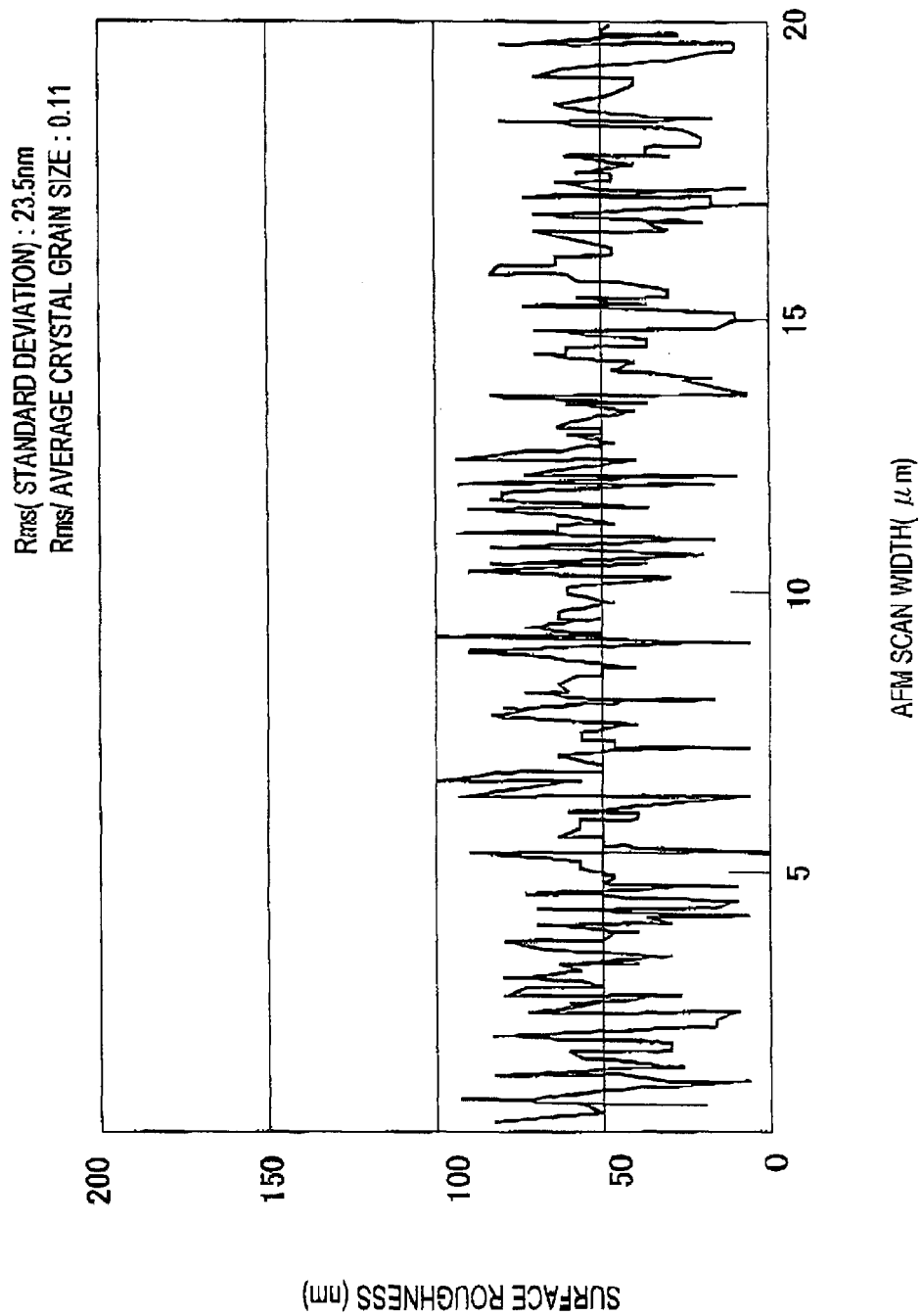
FIG. 14 shows a result of AFM measurement for explaining a morphology of the surface roughness in the case where the amorphous silicon film of the polysilicon thin film of embodiment 1 was immersed in the 1% aqueous solution of hydrofluoric acid for one minute and, then, in the 2% $H_2O_2$ solution for 100 minutes before the crystallization processing.

This value is especially small in comparison to the other standard deviations of the roughness that are: 24.0 nm in the case of FIG. 12 in which the immersing processing in only the hydrofluoric acid solution was performed; 24.3 nm in the case of FIG. 13 in which the immersing processing was not performed at all; and 23.5 nm in the case of FIG. 14 in which the immersing processing in the hydrofluoric acid solution for one minute and, then, in the 2% $H_2O_2$ solution for 100 minutes was performed. The experimental data indicated a tendency similar to those of the average crystal grain size and its standard deviation described previously.

Also, as an index denoting the nonuniformity of the surface texture relative to the average crystal grain size, an evaluation using a ratio of the standard deviation of the irregularities on the surface to the average crystal grain size was attempted. As a result, the index denoting the surface texture described above was found to be about 2% for FIG. 11 and also found to be 11%, 12% and 11% for FIGS. 12, 13 and 14, respectively.

As exemplified in FIG. 12, when the immersing processing in only the hydrofluoric acid solution is performed to the amorphous silicon film, the roughness derived from the crystal grain boundary is relatively small. However, abnormal protrusions not smaller than 100 nm, which are considered to have been derived from the water droplets remaining after the subsequent cleaning processing with the pure water, are caused to appear, with the result that the standard deviation of the roughness on the surface shows a very large value, i.e., 24.0 nm.

Moreover, as exemplified in FIGS. 13 and 14, if the laser annealing is performed under the condition that an oxide film having a thickness not smaller than 1 nm is formed on the amorphous silicon film, the roughness derived from the crystal grain boundary are large, with the result that the standard deviation of the roughness on the surface shows a very large value.

As described above, it is possible to suppress the surface roughness formation derived from the crystal grain boundary by performing the laser annealing processing for the crystallization after the native oxide is removed completely from the surface of the amorphous silicon film by the immersing processing in the hydrofluoric acid solution, followed by newly forming an oxide layer having a thickness of 0.1 to 0.4 nm on the surface by subsequent immersing processing in the $H_2O_2$ solution for a short time.

In addition, since it is possible to suppress the protrusion occurrence derived from the water droplets remaining on the crystal surface after the processing with the pure water, it in also possible to suppress the standard deviation of the roughness formed on the surface to 10 nm or less. Further, the standard deviation of the irregularities formed on the surface relative to the crystal grain diameter is about 2%, making it possible to realize a very flat and satisfactory surface morphology.

Note that, in embodiment 1 described above, the extremely thin oxide film was formed on the surface of the amorphous silicon film by the immersing processing for a short time in the $H_2O_2$ solution. However, it is also possible to obtain the similar result by the formation of the extremely thin oxide layer (film thickness of about 0.1 nm to 0.4 nm) on the amorphous silicon film by means of, for example, a method of a UV light irradiation under an oxygen atmosphere, a method of immersing in the aqueous ozone solution, or immersing in the hydrofluoric acid solution diluted to 2/1000 or less in place of the 1% hydrofluoric acid solution or the like, after removal of the native oxide film from the surface of the amorphous silicon film by the immersing in the hydrofluoric acid solution.

What is most important in the crystallizing process described above is to control the thickness of the oxide film to 0.1 nm to 0.4 nm, the oxide film being formed on the amorphous silicon film before the laser annealing processing. When the oxide film thickness is, for example, less than 0.1 nm, abnormal protrusions are generated by the water droplets remaining on the surface of the amorphous silicon film after the cleaning processing with the pure water. On the other hand, when the oxide film thickness exceeds, for example, 0.4 nm, the oxide film suppresses generation of the crystal nuclei in the step of the laser annealing processing, with the result that large roughness are formed on the surface.

Note that a Corning glass 7059 was used as the substrate in embodiment 1. However, a transparent substrates such as a quartz substrate a PET (polyethylene terephthalate) substrate or the like may be used.

Further, the hydrogen contained in the amorphous silicon film is removed by annealing the amorphous silicon film in a furnace having the temperature controlled at 450° C. after deposition of the amorphous silicon film by the ordinary plasma CVD method. Alternatively, the amorphous silicon film can be fabricated by an LPCVD (Low Pressure Chemical Vapor Deposition) method, a sputtering method, a vapor deposition method or the like.

Also, a silicon thin film was exemplified in embodiment 1 described above. However, the thin film is not limited to the silicon thin film, No inconvenience is caused even if the present invention is performed on, for example, a germanium thin film or a thin film of a mixture consisting of silicon and germanium.

Further, in embodiment 1, the XeCl laser beam having a wavelength of 308 nm was used for the laser annealing processing. However, the laser beam used in the present invention is not limited to the XeCl laser beam. In the present invention, for, example, an excimer laser using KrF, a YAG laser or an Ar laser or the like.

An example of a thin film transistor using the polysilicon film described above will now be described.

Figure 15:
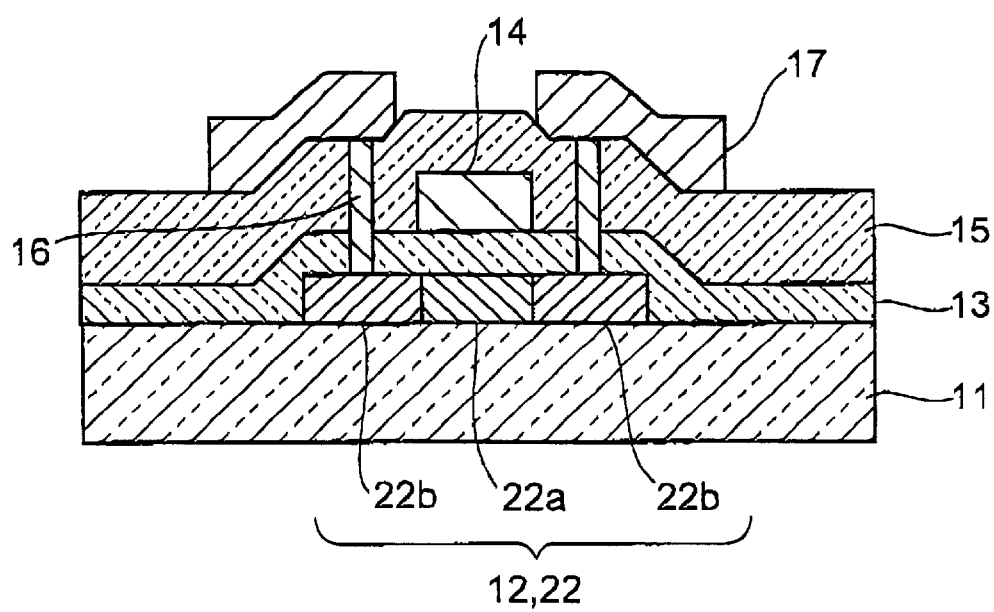
FIG. 15 is a cross sectional view showing a structure of a transistor using a polysilicon thin film of embodiment 2.

FIG. 15 is a cross sectional view for explaining a polysilicon thin film transistor constituting embodiment 2 of the present invention.

Firstly, an amorphous silicon film 12 is formed in a thickness of about 50 nm on, for example, a glass substrate 11 by a well-known plasma CVD method.

Then, the substrate 11 is inserted into a furnace controlled to have a temperature about 450° C. and a nitrogen atmosphere to perform an annealing processing to the substrate 11 for about 30 minutes to remove hydrogen contained in the amorphous silicon film 12.

Since the native oxide layer having an appreciable thickness is formed on the surface of the amorphous silicon film 12, the substrate 11 is immersed in, for example, the aqueous solution containing about 1% of hydrofluoric acid for about 1 minute to remove completely the native oxide layer. Subsequently, the substrate 11 is immersed in an aqueous solution containing about 2% of $H_2O_2$ for about one minute to newly form the extremely thin oxide layer (not shown) having a thickness of about 0.15 nm on the surface of the amorphous silicon film 12, followed by cleaning the glass substrate 11 with the pure water.

Next, the amorphous silicon film 12 was irradiated with, for example, the XeCl laser beam having the wavelength of 308 nm and a pulse width of 20 nsec through the oxide film described above to crystallize the amorphous silicon film 12, and thus forming a polysilicon film 22. The energy density of the laser beam used was 460 mJ/cm$^2$.

Further, a photoresist film is formed on the polysilicon film 22 by using a well-known photolithography method, followed by performing a light exposure and development to form a resist pattern of predetermined dimensions on the polysilicon film 22. Then, an island-like polysilicon film 22 is formed by, for example, a plasma etching method widely known to the art using the resist pattern used as a mask.

In the next step, a silicon oxide film 13 having a thickness of 100 nm is formed as an insulating film on the island-like polysilicon film 22 by using, for example, a plasma CVD method. Then, a TiW electrode layer 14 as a gate electrode was formed by, for example, the sputtering method.

Moreover, a channel region 22a, a source region 22b and a drain region 22b were formed in the above-described island-like polysilicon film 22 by a well-known ion implantation method using the patterned TiW electrode layer 14 as a mask.

In the case of forming an N-type transistor, phosphorus as an N-type impurity is implanted into the source region 22b and the drain region 22b. Also, in the case of forming a P-type transistor, boron as a P-type impurity is implanted into the source region 22b and the drain region 22b.

Then, a so-called "activation annealing" was performed for recovering the crystallinity of the polysilicon film 22 that received a damage by the ion implantation of the impurity atoms described above. Although an RTA (Rapid Thermal Annealing) method was used in this embodiment, it is possible to achieve the activation by a general furnace annealing method.

Next, a silicon oxide insulating film 15 having a thickness of 500 nm was again formed on the silicon oxide film 13 including the TiW electrode layer 14 by the plasma CVD method, Then, contact holes 16 were formed extending through the silicon oxide film 13 and the silicon oxide insulating film 15 to reach the source region 22b and the drain region 22b, respectively, thereby forming a multi-layered film of TiW/Al electrically connected to the source region 22b and the drain region 22b. Then, a patterning processing was performed to the multi-layered film described above by using the photolithography method to form an electrode layer 17.

Finally, an annealing processing was performed under a hydrogen atmosphere at 400° C. for 60 minutes to complete the manufacture of an N-type polysilicon thin film transistor exemplified in FIG. 15.

Figure 16:
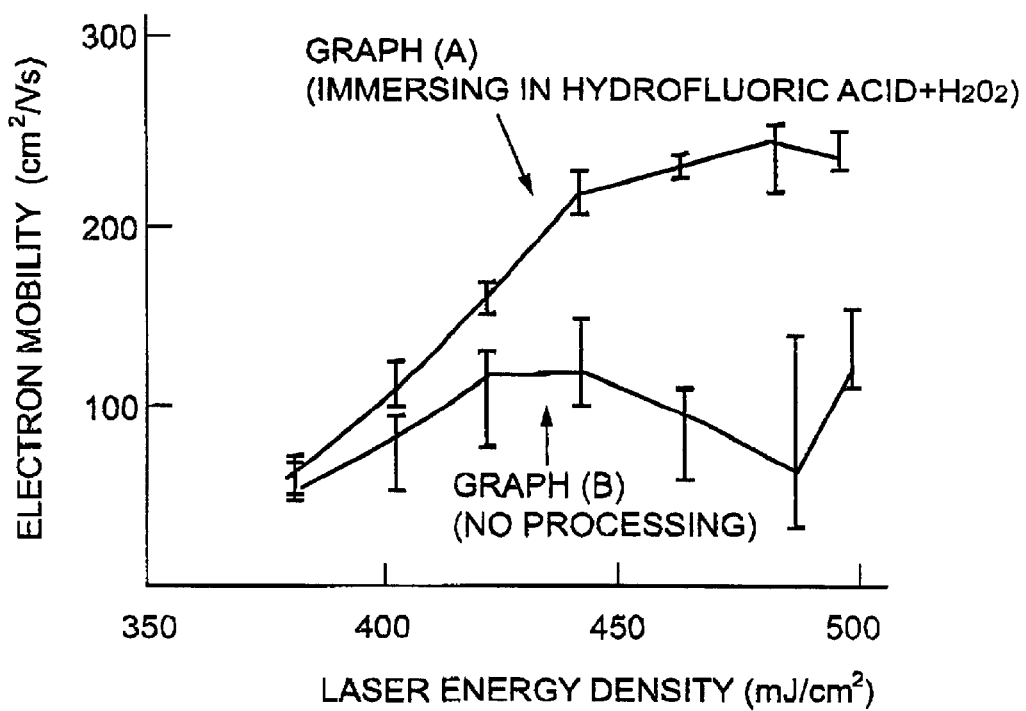
FIG. 16 is a graph showing a relationship between the electron mobility in the polysilicon thin film transistor and the energy density of the laser beam used for crystallization in respect of embodiment 2.

FIG. 16 is a graph showing an electron mobility characteristics of the thin film transistor thus formed, In the graph of FIG. 16, the electron mobility is plotted on the ordinate, and the energy density of the laser beam used for the crystallization of the amorphous silicon film is plotted on the abscissa of the graph. The error bars shown in the graph denote the maximum values and the minimum values of the electron mobility actually measured at about 50 points under one condition. On the other hand, the broken line graph was prepared by joining the average values of the bar graphs. Graph (A) shown in FIG. 16 shows the case where the immersing processing in the 1% hydrofluoric acid solution for one minute and, then, in the 2% $H_2O_2$ solution for one minute was performed prior to the annealing processing for crystallizing the amorphous silicon film. Graph (B) shows the case where such a immersing processing was not performed.

As a result, the change in the electron mobility of the thin film transistor relative to the energy density for the crystallization coincides with the cases of the average crystal grain size shown in FIG. 4 and of the (111) plane crystal orientation ratio shown in FIG. 10. Also, the tendency in the change of the electron mobility relative to the annealing processing for the crystallization well coincides with the nonuniformity of the crystal grain sizes shown in FIGS. 5 to 8, though the comparison is based on the point data.

This indicates that, in order to increase the electron mobility of the polysilicon thin film transistor, it is important to permit the crystals of the polysilicon film formed by the annealing processing to be oriented preferentially on the (111) plane. It is also indicated that, in order to suppress the nonuniformity in the electron mobility, it is necessary to reduce the nonuniformity of the crystal grain sizes.

Also, this implies that, in order to improve the electron mobility, it is indispensable to perform the cleaning processing to the surface of the amorphous silicon film before the annealing processing for the crystallization, i.e., the cleaning processing that the substrate is immersed in the hydrofluoric acid solution and, then, in the $H_2O_2$ solution.

Accordingly, as shown in FIG. 16, the electron mobility, which is only 50 $cm^2/v \cdot s$ or less, in the case where the energy density of the laser beam used for the annealing processing for the crystallization is not higher than 400 $mJ/cm^2$, is rapidly increased under the energy density at 400 $mJ/cm^2$ or more. Particularly, the electron mobility is increased to reach not lower than 200 $cm^2/v \cdot s$ under the energy density not lower than 440 $mJ/cm^2$. Further, it is clearly seen that the nonuniformity of the electron mobility is markedly diminished, compared with the case where the cleaning processing described above was not performed.

In embodiment 2 described above, the Corning 7059 glass was used as a substrate for forming the amorphous silicon film. However, it is also possible to use a transparent substrate such as the quartz substrate, PET (polyethylene terephthalate) substrate or the like in place of, the Corning 7059 glass. Also, it is possible to use a film-forming method such as the LPCVD method, the sputtering method, a vapor deposition method or the like in place of the plasma CVD method employed in embodiment 2. Further, embodiment 2 is directed to the use of a silicon thin film as an example. However, the thin film used in the present invention is not limited to the silicon thin film. The effects similar to those obtained in embodiment 2 described above can be obtained in the case where the present invention is performed on, for example, the germanium thin film or the thin film made of the mixture of silicon and germanium.

Further, the extremely thin oxide layer was formed on the surface of the amorphous silicon film by immersing the substrate in the $H_2O_2$ solution. Alternatively, it is also possible to form such an extremely thin film by, for example, irradiating the amorphous silicon film immediately after the cleaning processing with the hydrofluoric acid solution with the UV light under the oxygen atmosphere, by immersing the amorphous silicon film in the aqueous ozone solution for a predetermined time, or by using the hydrofluoric acid solution diluted to 2/1000 or less in dipping the amorphous silicon film in the hydrofluoric acid solution. These alternative methods also show the effects similar to embodiment 2.

Also, the XeCl laser beam having a wavelength of 308 nm was used for crystallizing the amorphous silicon film. Alternatively, the KrF laser beam having a wavelength of 248 nm, the YAG laser beam, the Ar laser beam or the like may be used in place of the XeCl laser beam described above. Also, the crystallizing processing may be performed either under vacuum or under a nitrogen gas atmosphere.

The polysilicon thin film transistor described in conjunction with embodiment 2 exhibits a high electron mobility not lower than 200 $cm^2/v \cdot s$. Therefore, in the active matrix type liquid crystal display device in which the ordinary amorphous silicon thin film transistor is provided in the pixel region, it is possible to allow the polysilicon thin film transistor formed by crystallizing the peripheral portion of the pixel region to be substituted for a driver circuit formed separately.

Particularly, the polysilicon thin film described in the embodiments of the present invention is low in nonuniformity in the diameters of the crystal grains constituting the thin film, and it is possible to suppress the roughness on the surface of the crystallized thin film. Accordingly, the present invention can provide a thin film transistor low in nonuniformity of the electric characteristics and, thus, adapted for application to the driver circuit.

As described above, it is possible in the present invention to form a polysilicon thin film, which is fabricated by crystallizing the amorphous silicon film, having a high crystal orienting properties on the (111) plane and low in nonuniformity in the crystal grain sizes and in the protrusion occurrence on the surface. As a result, the transistor using the thin film has a high electron mobility not lower than 200 $cm^2/v \cdot s$.

Therefore, it is possible to realize a liquid crystal display device exhibiting excellent display characteristics by using the thin film transistor described above for the use of the liquid crystal display.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications a fall within the ambit of the appended claims.

We claim:

1. A liquid crystal display element comprising a substrate and a semiconductor thin film provided on the substrate, wherein the semiconductor thin film comprises an aggregate of crystal grains preferentially oriented on the (111) plane in a direction approximately parallel to a surface of said substrate, an average crystal grain size of said crystal grains on the surface of said semiconductor thin film is not larger than 300 nm, and a standard deviation of grain diameters of said crystal grains is not larger than 30% of the average crystal grain diameter.

2. The liquid crystal display element according to claim 1, wherein said semiconductor thin film comprises at least one of silicon, germanium and a mixture of silicon and germanium.

3. The liquid crystal display element according to claim 1, wherein a standard deviation of the irregularities on the surface of said semiconductor thin film is not larger than 10% of said average crystal grain diameter.

* * * * *